United States Patent
Bui et al.

(10) Patent No.: US 7,709,921 B2
(45) Date of Patent: May 4, 2010

(54) PHOTODIODE AND PHOTODIODE ARRAY WITH IMPROVED PERFORMANCE CHARACTERISTICS

(75) Inventors: Peter Steven Bui, Cerritos, CA (US); Narayan Dass Taneja, Long Beach, CA (US)

(73) Assignee: UDT Sensors, Inc., Hawthorne, CA (US)

(*) Notice: Subject to any disclaimer, the term of this patent is extended or adjusted under 35 U.S.C. 154(b) by 0 days.

(21) Appl. No.: 12/199,558

(22) Filed: Aug. 27, 2008

(65) Prior Publication Data
US 2010/0051821 A1    Mar. 4, 2010

(51) Int. Cl.
H01L 31/06    (2006.01)

(52) U.S. Cl. .......................... 257/461; 257/443; 438/57

(58) Field of Classification Search ................ 257/461, 257/432, 436, 437, 443; 438/57
See application file for complete search history.

(56) References Cited

U.S. PATENT DOCUMENTS

| | | | |
|---|---|---|---|
| 3,041,226 A | 6/1962 | Pennington | |
| 3,713,921 A | 1/1973 | Fleischer et al. | |
| 3,765,969 A | 10/1973 | Kragness et al. | |
| 3,801,390 A | 4/1974 | Lepselter et al. | |
| 3,808,068 A | 4/1974 | Johnson et al. | |
| 4,210,923 A | 7/1980 | North et al. | |
| 4,290,844 A | 9/1981 | Rotolante et al. | |
| 4,874,939 A | 10/1989 | Nishimoto et al. | |
| 4,887,140 A | 12/1989 | Wang | |
| 4,904,608 A | 2/1990 | Gentner et al. | |
| 4,904,861 A | 2/1990 | Epstein et al. | |
| 4,998,013 A | 3/1991 | Epstein et al. | |
| 5,049,962 A | 9/1991 | Huang et al. | |
| 5,053,318 A | 10/1991 | Gulla et al. | |
| 5,144,379 A | 9/1992 | Eshita et al. | |
| 5,214,276 A | 5/1993 | Himoto et al. | |
| 5,237,197 A | 8/1993 | Snoeys et al. | |
| 5,252,142 A | 10/1993 | Matsuyama et al. | |
| 5,254,480 A | 10/1993 | Tran | |

(Continued)

FOREIGN PATENT DOCUMENTS

EP    0 347 157    12/1989

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, Nov. 1995.

(Continued)

Primary Examiner—Mark Prenty
(74) Attorney, Agent, or Firm—Patentmetrix

(57) ABSTRACT

The present invention is a photodiode and/or photodiode array, having a p+ diffused area that is smaller than the area of a mounted scintillator crystal, designed and manufactured with improved device characteristics, and more particularly, has relatively low dark current, low capacitance and improved signal-to-noise ratio characteristics. More specifically, the present invention is a photodiode and/or photodiode array that includes a metal shield for reflecting light back into a scintillator crystal, thus allowing for a relatively small p+ diffused area.

15 Claims, 6 Drawing Sheets

U.S. PATENT DOCUMENTS

| | | | |
|---|---|---|---|
| 5,276,955 | A | 1/1994 | Noddin et al. |
| 5,408,122 | A | 4/1995 | Reele |
| 5,430,321 | A | 7/1995 | Effelsberg |
| 5,446,751 | A | 8/1995 | Wake |
| 5,501,990 | A | 3/1996 | Holm et al. |
| 5,576,559 | A | 11/1996 | Davis |
| 5,599,389 | A | 2/1997 | Iwasaki |
| 5,656,508 | A | 8/1997 | So et al. |
| 5,818,096 | A | 10/1998 | Ishibashi et al. |
| 5,825,047 | A | 10/1998 | Ajisawa et al. |
| 5,869,834 | A | 2/1999 | Wipenmyr |
| 5,889,313 | A | 3/1999 | Parker |
| 5,923,720 | A | 7/1999 | Barton et al. |
| 5,928,438 | A | 7/1999 | Salami et al. |
| 6,027,956 | A | 2/2000 | Irissou |
| 6,218,684 | B1 | 4/2001 | Kuhara et al. |
| 6,326,300 | B1 | 12/2001 | Liu et al. |
| 6,326,649 | B1 | 12/2001 | Chang et al. |
| 6,352,517 | B1 | 3/2002 | Flock et al. |
| 6,426,991 | B1 | 7/2002 | Mattson et al. |
| 6,438,296 | B1 | 8/2002 | Kongable |
| 6,489,635 | B1 | 12/2002 | Sugg |
| 6,504,158 | B2 | 1/2003 | Possin |
| 6,510,195 | B1 | 1/2003 | Chappo et al. |
| 6,546,171 | B2 | 4/2003 | Fukutomi |
| 6,569,700 | B2 | 5/2003 | Yang |
| 6,593,636 | B1 | 7/2003 | Bui et al. |
| 6,670,258 | B2 | 12/2003 | Carlson et al. |
| 6,734,416 | B2 | 5/2004 | Carlson et al. |
| 6,772,729 | B2 | 8/2004 | Brosseau et al. |
| 6,826,080 | B2 | 11/2004 | Park et al. |
| 7,057,254 | B2 | 6/2006 | Bui et al. |
| 7,112,465 | B2 | 9/2006 | Goushcha et al. |
| 7,279,731 | B1 | 9/2007 | Bui et al |
| 2001/0034105 | A1 | 10/2001 | Carlson |
| 2002/0056845 | A1 | 5/2002 | Iguchi et al. |
| 2004/0104351 | A1 | 6/2004 | Shibayama |
| 2004/0206886 | A1 | 10/2004 | Carlson et al. |
| 2004/0222358 | A1 | 11/2004 | Bui et al. |
| 2004/0241897 | A1 | 12/2004 | Rhee et al. |
| 2004/0262652 | A1 | 12/2004 | Goushcha et al. |
| 2006/0220078 | A1 | 10/2006 | Bui et al. |
| 2006/0255420 | A1 | 11/2006 | Bui et al. |
| 2006/0278898 | A1 | 12/2006 | Shibayama |
| 2007/0090394 | A1 | 4/2007 | Bui et al. |
| 2007/0257329 | A1 | 11/2007 | Bui et al. |
| 2007/0278534 | A1 | 12/2007 | Bui et al. |
| 2007/0296005 | A1 | 12/2007 | Bui et al. |
| 2008/0067622 | A1 | 3/2008 | Bui et al. |
| 2008/0099871 | A1* | 5/2008 | Bui et al. .................... 257/461 |
| 2008/0128846 | A1 | 6/2008 | Bui et al. |
| 2008/0277753 | A1 | 11/2008 | Bui et al. |

FOREIGN PATENT DOCUMENTS

| | | |
|---|---|---|
| EP | 0436282 | 7/1991 |
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

Step 441

Step 442a, 442b, 442c, 442d, 442e

Step 443

Step 444

Step 445

Step 446

PHOTODIODE AND PHOTODIODE ARRAY WITH IMPROVED PERFORMANCE CHARACTERISTICS

FIELD OF THE INVENTION

The present invention relates generally to the field of radiation detectors, and in particular, to a photodiode and/or photodiode array having improved device performance characteristics. Specifically, the present invention relates to a photodiode and/or photodiode array, having a p+ diffused area that is both relatively small and smaller than the area of a mounted scintillator crystal, designed and manufactured with improved device characteristics, and more particularly, relatively low dark current, low capacitance and improved signal-to-noise ratio characteristics. More specifically, the present invention relates to a photodiode and/or photodiode array that includes a metal shield for reflecting light back into a scintillator crystal, thus allowing for a relatively small p+ diffused area.

BACKGROUND OF THE INVENTION

Active solid-state semiconductor devices, and in particular, silicon photodiodes, are among the most popular photodetectors having a sufficiently high performance over a large wavelength range and a sufficient ease of use. Silicon photodiodes are sensitive to light in the wide spectral range, extending from deep ultraviolet through visible to near infrared, which is approximately 200 nm to 1100 nm. Silicon photodiodes, by using their ability to detect the presence or absence of minute light intensities, facilitate the precise measurement of these minute light intensities upon appropriate calibration. For example, appropriately calibrated silicon photodiodes detect and measure light intensities varying over a wide range, from very minute light intensities of below $10^{-13}$ watts/cm$^2$ to high intensities above $10^{-3}$ watts/cm$^2$.

Silicon photodiodes can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, security screening and threat detection, thin photochip applications, and a wide range of computing applications.

Typically, photodiode arrays employ a scintillator material for absorbing high energy (ionizing) electromagnetic or charged particle radiation, which, in response, fluoresces photons at a characteristic wavelength. Scintillators are defined by their light output (number of emitted photons per unit absorbed energy) short fluorescence decay times, and optical transparency at wavelengths of their own specific emission energy. The lower the decay time of a scintillator, that is, the shorter the duration of its flashes of fluorescence are, the less so-called "dead time" the detector will have and the more ionizing events per unit of time it will be able to detect. Scintillators are used to detect electromagnetic waves or particles in many security and detection systems, including CT, X-ray, and gamma ray. There, a scintillator converts the energy to light of a wavelength which can be detected by photomultiplier tubes (PMTS) or P-N junction photodiodes.

Photodiodes are typically characterized by certain parameters, such as, among others, electrical characteristics, optical characteristics, current characteristics, voltage characteristics, and noise. Electrical characteristics predominantly comprise shunt resistance, series resistance, junction capacitance, rise or fall time and/or frequency response. Optical characteristics comprise responsivity, quantum efficiency, non-uniformity, and/or non-linearity. Photodiode noise may comprise, among others, thermal noise, quantum, photon or shot noise, and/or flicker noise.

In an effort to increase the signal to noise ratio and enhance the contrast of the signal, it is desirable to increase the light-induced current of photodiodes. Thus, photodiode sensitivity is enhanced while the overall quality of the photodiode is improved. Photodiode sensitivity is crucial in low-level light applications and is typically quantified by a parameter referred to as noise equivalent power (NEP), which is defined as the optical power that produces a signal-to-noise ratio of one at the detector output. NEP is usually specified at a given wavelength over a frequency bandwidth.

Photodiodes absorb photons or charged particles, facilitating detection of incident light or optical power and generating current proportional to the incident light, thus converting the incident light to electrical power. Light-induced current of the photodiode corresponds to the signal while "dark" or "leakage" current represents noise. "Dark" current is that current that is not induced by light, or that is present in the absence of light. Photodiodes process signals by using the magnitude of the signal-to-noise ratio.

Leakage current is a major source of signal offset and noise in current photodiode array applications. Leakage current flows through the photodiode when it is in a "dark" state, or in the absence of light at a given reverse bias voltage applied across the junction. Leakage current is specified at a particular value of reverse applied voltage. Leakage current is temperature dependent; thus, an increase in temperature and reverse bias results in an increase in leakage or dark current. A general rule is that the dark current will approximately double for every 10° C. increase in ambient temperature. It should be noted, however, that specific diode types can vary considerably from this relationship. For example, it is possible that leakage or dark current will approximately double for every 6° C. increase in temperature.

In certain applications, it is desirable to produce optical detectors having small lateral dimensions and spaced closely together. For example in certain medical applications, it is desirable to increase the optical resolution of a detector array in order to permit for improved image scans, such as computed tomography (CT) scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated.

Thus, an additional disadvantage with conventional photodiode arrays is the amount and extent of crosstalk that occurs between adjacent detector structures, primarily as a result of minority carrier leakage current between diodes. The problem of crosstalk between diodes becomes even more acute as the size of the detector arrays, the size of individual detectors, the spatial resolution, and spacing of the diodes is reduced.

Various approaches have been used to minimize such crosstalk including, but not limited to, providing inactive photodiodes to balance the leakage current, as described in U.S. Pat. Nos. 4,904,861 and 4,998,013 to Epstein et al., the utilization of suction diodes for the removal of the slow diffusion currents to reduce the settling time of detectors to acceptable levels, as described in U.S. Pat. No. 5,408,122, and providing a gradient in doping density in the epitaxial layer, as described in U.S. Pat. No. 5,430,321 to Effelsberg.

In addition to leakage current and effects of crosstalk, noise is often a limiting factor for the performance of any device or system. In almost every area of measurement, the limit to the detectability of signals is set by noise, or unwanted signals that obscure the desired signal. As described above, the NEP is used to quantify detector noise. Noise issues generally have an important effect on device or system cost. Conventional photodiodes are particularly sensitive to noise issues. Like other types of light sensors, the lower limits of light detection for photodiodes are determined by the noise characteristics of the device.

As described above, the typical noise components in photodiodes include thermal noise; quantum or shot noise; and flicker noise. These noise components collectively contribute to the total noise in the photodiode. Thermal noise, or Johnson noise, is inversely related to the value of the shunt resistance of photodiode and tends to be the dominant noise component when the diode is operated under zero applied reverse bias conditions. Shot noise is dependent upon the leakage or dark current of photodiode and is generated by random fluctuations of current flowing through the device, which may be either dark current or photocurrent. Shot noise tends to dominate when the photodiode is used in photoconductive mode where an external reverse bias is applied across the device. As an example, detector noise generated by a planar diffused photodiode operating in the reverse bias mode is a combination of both shot noise and thermal noise. Flicker noise, unlike thermal or shot noise, bears an inverse relationship to spectral density. Flicker noise may dominate when the bandwidth of interest contains frequencies less than 1 kHz.

Secondary issues also contribute to dark noise and other noise sources that impact photodiode sensitivity. These include primarily determination and/or selection of apt active area specifications (geometry and dimensions), response speed, quantum efficiency at the wavelength of interest, response linearity, and spatial uniformity of response, among others.

Further, when a photodiode is used in conjunction with an electronic amplifier, the capacitance of the photodiode can be a dominating contributing characteristic in the overall noise. It is therefore desirable to design and fabricate photodiodes that have low overall capacitance.

In CT applications, such as those employed for baggage screening, it is desirable to have high density photodiode arrays with low dark current, low capacitance, high signal-to-noise ratio, high speed and low crosstalk.

As mentioned above, however, there are numerous problems with conventional photodiodes that attempt to achieve these competing and often conflicting characteristics. Referring now to FIGS. 1a and 1b, top and cross-sectional views, respectively, of a conventional photodiode are shown. The photodiode shown in FIGS. 1a and 1b is typical in that it is fabricated such that the p+ diffused area has the same dimensions as the scintillator crystal. For example, and as described in greater detail below, if the scintillator crystal has a length of 2 mm and a width of 2 mm, then the p+ diffused area is also 2 mm×2 mm. This is a typical design characteristic for photodiodes used in x-ray/scintillator applications.

Referring to FIG. 1a, conventional photodiode 100 comprises substrate material 102, which is typically a bulk silicon substrate lightly doped with a suitable impurity of a selected conductivity type, such as p-type or n-type. In order to meet desired capacitance performance specification, the device is fabricated on a n-type silicon substrate wafer that is of high resistivity, typically on the order of 4500-9000 ohm cm. The photodiode comprises a shallow p+ diffused region 110, deep p+ diffused region 112, and anode metal pads 114a for forming at least one contact and 114b for forming at least one wire bond. It should be noted that, in a typical photodiode chip, distance 129 between the p+ diffused area 110 and the edge 130 of the photodiode 100 ranges from 0.1 mm to 0.125 mm.

Referring to FIG. 1b, conventional photodiode 100 comprises a shallow p+ diffused region 110, which has a top surface area of 2 mm×2 mm. Conventional photodiode 100 further comprises a scintillator crystal 120, which is of the same dimensions as the p+ active area/diffused region 110 as described above, or 2 mm×2 mm, mounted on the photodiode using an epoxy. Conventional photodiode 100 also comprises deep p+ diffused region 112; anode metal pads 114a for forming at least one contact and 114b for creating at least one wire bond; and a layer 115 comprised of silicon oxide/silicon nitride that acts as junction passivation and antireflection layer.

The conventional photodiode shown in FIGS. 1a and 1b are, however, fabricated on an expensive, high resistivity silicon substrate material 102 to accommodate for a large p+ diffused area while still retaining low overall capacitance and thus, improved performance. Further, a large p+ diffused area has high dark current since the amount of dark current is proportional to the size of the p+ diffused area, and thus, a low signal to noise ratio. Still further, because the p+ diffused area is large, there is little distance between the p+ diffused area and the edge of the chip, there is an increase in sawing damage and thus, overall yield may be relatively low.

Thus, conventional photodiodes suffer from low signal-to-noise ratios and sub-optimal characteristics. Conventional photodiodes are also known to have high cost of manufacturing and low yield.

Therefore, what is needed is a photodiode and photodiode array that can be manufactured on a low resistivity substrate wafer.

What is also needed is a photodiode and photodiode array that can be manufactured with a relatively small p+ diffused active area to obtain low capacitance while still retaining high signal current.

In addition, there is need in the art for photodiodes that have improved overall performance characteristics, allow for high yield and can be inexpensively manufactured.

SUMMARY OF THE INVENTION

In one embodiment, the present invention is a photodiode comprising at least a front side and a back side, fabricated from a low resistivity substrate, having a resistivity in the range of 1000 ohm cm to 2000 ohm cm, further comprising a shallow p+ diffused region on the front side, wherein the shallow p+ region is smaller than a scintillator crystal mounted on the front side of the photodiode; at least one back side cathode contact and at least one front side anode contact, comprised of metal; and a reflective metal shield on at least a portion of said front side, wherein said metal shield reflects incident light back into said scintillator crystal.

In one embodiment, the present invention is a photodiode array comprising a low resistivity substrate having at least a front side and a back side, wherein said low resistivity is in the range of 1000 ohm cm to 2000 ohm cm; a plurality of diode elements integrally formed in the substrate forming said array, wherein each diode element has a shallow p+ diffused region on said front side, wherein said shallow p+ region is smaller than a scintillator crystal mounted on the front side of the photodiode; at least one back side cathode contact and at least one front side anode contact, comprised of metal; and a reflective metal shield on at least a portion of said front side, wherein said metal shield reflects incident light back into the scintillator crystal.

In one embodiment, the scintillator crystal mounted on the front side of the photodiode has a top surface area of 2 mm×2 mm and the shallow p+ diffused region is on the order of 1 mm or less in length and 1 mm or less in width.

In one embodiment, the reflective metal shield comprises aluminum.

In one embodiment, a distance between the shallow p+ diffused region and an edge of the photodiode ranges from 0.3 mm to 0.5 mm.

The photodiode of the present invention further comprises an anti-reflective layer which, in one embodiment, has a thickness of 900 Å. In another embodiment, the anti-reflective layer is formed from $SiO_2$ having a thickness of 150 Å and $Si_3N_4$ having a thickness of 400 Å, for a total layer thickness of 550 Å.

In one embodiment, the present invention describes a method of fabricating a photodiode on a low resistivity substrate wafer, on the order of 1000 ohm cm to 2000 ohm cm, having a front side and a back side, said method comprising the steps of: providing an oxide layer on both the front side and the back side, having a thickness of 10,000 Å; implementing an etching process on both the front side and back side to define a plurality of regions on the front side and back side; filling the plurality of regions with n+ dopant; depositing an oxide layer on both the front side and the back side of the wafer; creating a deep p+ diffused region on the front side; fabricating an active area on said front side, wherein said active area is smaller than a scintillator crystal mounted on the front side of the photodiode; forming an anti-reflective layer on the front side of said device; forming a shallow p+ active area region; forming at least one contact window; and performing a metal deposition process to etch metal on both the front side and back side of the device wafer, wherein said metal deposition process creates connections and wherein said metal deposition process forms a reflective metal shield on the front side, that reflects incident light back into the scintillator crystal mounted on the photodiode.

BRIEF DESCRIPTION OF THE DRAWINGS

These and other features and advantages of the present invention will be appreciated, as they become better understood by reference to the following detailed description when considered in connection with the accompanying drawings wherein.

DETAILED DESCRIPTION OF THE INVENTION

Figure 1A:
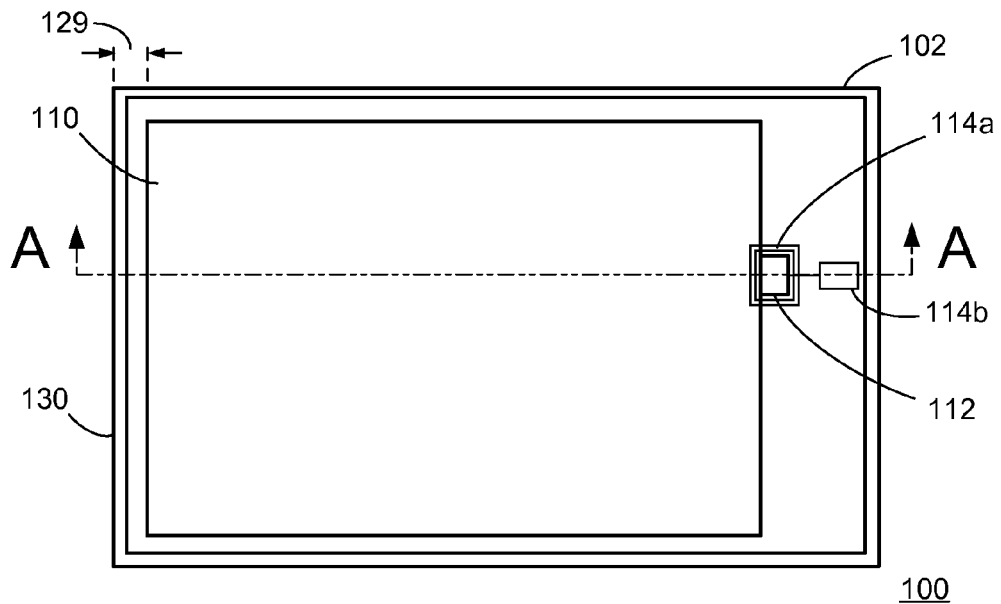
FIG. 1a is a top view of a conventional, prior art photodiode.

The present invention is directed towards a photodiode and/or photodiode array having improved device characteristics, such as low capacitance, low dark current, improved signal-to-noise ratio, low resistivity starting material, and lower fabrication and manufacturing costs.

In one embodiment, the present invention is directed towards a photodiode characterized by a relatively small p+ diffused area. In one embodiment, the present invention is directed towards a photodiode characterized by a p+ diffused area that is smaller than the area of a scintillator crystal that is mounted on the top surface of the photodiode.

In one embodiment, the present invention is directed towards a photodiode having a relatively small p+ diffused area, more specifically, on the order of 1 mm×1 mm or less, whereby the photodiode has reduced dark current and an improved signal-to-noise ratio. In one embodiment, the p+ diffused area of the photodiode is 1 mm×1 mm.

In one embodiment, the present invention is directed towards a photodiode and/or photodiode array in which at least a portion of the front or top surface of the photodiode or photodiode array is covered with a metal shield, employed as a reflective surface to reflect incident light back into a scintillator crystal mounted on the photodiode. In one embodiment, the metal shield is fabricated from aluminum.

In one embodiment, the present invention is directed towards a photodiode and/or photodiode array having a relatively small p+ diffused active area, in which at least a portion of the front or top surface of the photodiode or photodiode array is covered with a metal shield, employed as a reflective surface to reflect incident light back into a scintillator crystal mounted on the front side of the photodiode. In one embodiment, the relatively small p+ diffused area is smaller than the area of the scintillator crystal mounted on the front side of the photodiode.

In one embodiment, the reflective surface increases the performance of the photodiode and compensates for the smaller p+ diffused active area in terms of performance characteristics. Thus, present invention is directed towards a photodiode and/or photodiode array having a relatively small p+ diffused active area, smaller than the area of the scintillator crystal mounted on the front side of the photodiode, and a reflective metal shield, exhibiting improved device characteristics, such as low capacitance, low dark current, improved signal-to-noise ratio, low resistivity starting material, and lower fabrication and manufacturing costs.

In one embodiment, the present invention is directed towards a photodiode and/or that is fabricated on a low cost, low resistivity substrate wafer, ranging from 1000-2000 ohm cm while still retaining capacitance performance of the conventional 2 mm×2 mm photodiode described above, which is manufactured on an expensive, high resistivity silicon wafer, ranging from 4500-9000 ohm cm. In one embodiment, the low resistivity substrate wafer is a n-type silicon wafer. In one embodiment, the low resistivity substrate wafer is a p-type silicon wafer.

In one embodiment, the present invention is directed towards a photodiode having a relatively wide distance between the p+ diffused area and the edge of the photodiode, thus reducing sawing damage and increasing yield and throughput of the device.

The present invention is directed toward multiple embodiments. While the present invention is described in detail with respect to an individual photodiode element, it should be understood to those of ordinary skill in the art that a plurality of such photodiode elements may be aggregated on a substrate to form a photodiode array. Further, while the photodiode and photodiode array of present invention is described with respect to p+ diffused active areas on an n-type silicon wafer, it should be noted and understood by those of ordinary skill in the art that the present invention can be designed and manufactured with reverse polarity, and more specifically, n+ diffused active areas on p-type silicon substrate wafers. Thus, the present invention is not limited to the polarity presented herein.

Various modifications to the preferred embodiment, disclosed herein, will be readily apparent to those of ordinary skill in the art and the disclosure set forth herein may be applicable to other embodiments and applications without departing from the spirit and scope of the present invention and the claims hereto appended. Reference will now be made in detail to specific embodiments of the invention. Language used in this specification should not be interpreted as a general disavowal of any one specific embodiment or used to limit the claims beyond the meaning of the terms used therein.

Figure 2A:
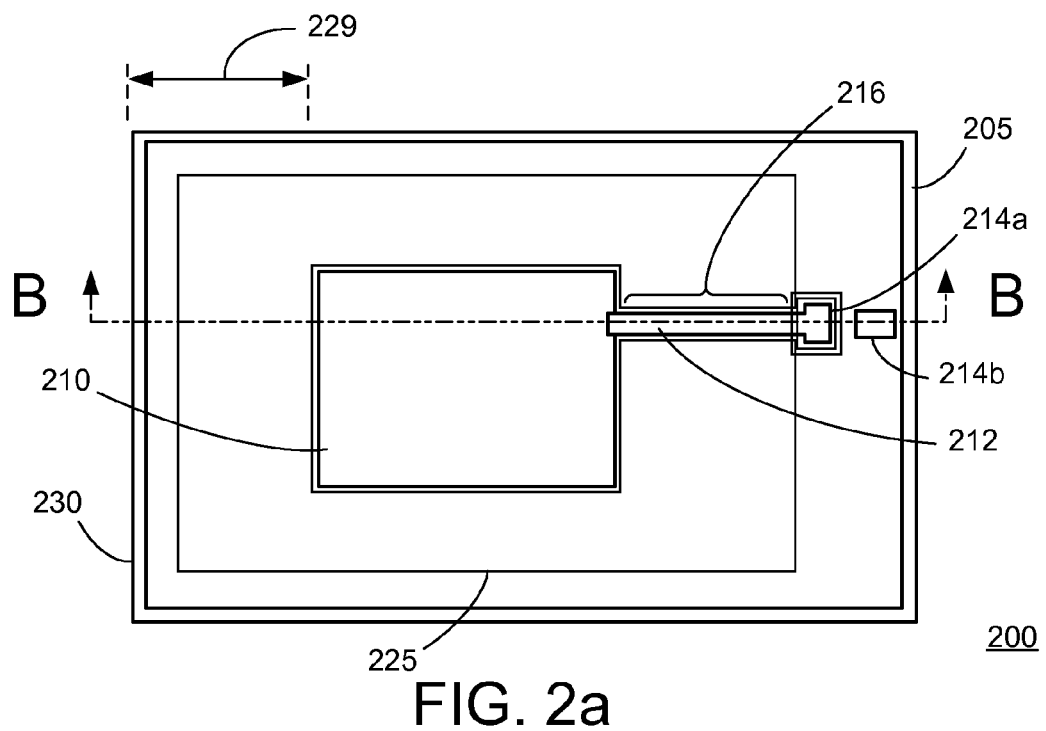
FIG. 2a is a top view of one embodiment of a photodiode of the present invention.
Figure 2B:
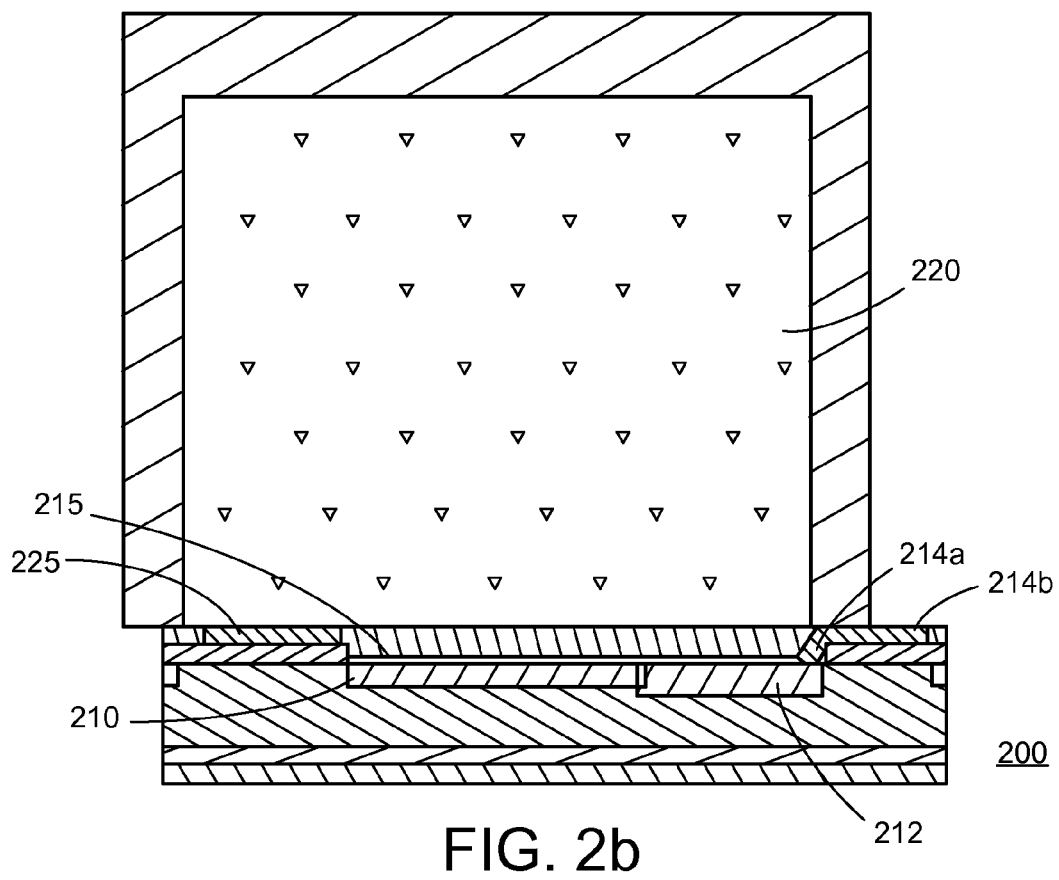
FIG. 2b is a cross-sectional view through the center of one embodiment of a photodiode of the present invention, with a scintillator crystal mounted on the front surface of the photodiode.

FIGS. 2a and 2b are top view and cross-sectional views, respectively, of one embodiment of a photodiode of the present invention. Photodiode 200 comprises shallow p+ diffused region 210, which, in one embodiment, has an area smaller than the area of mounted scintillator crystal 220, shown in FIG. 2b and described in greater detail below. In one embodiment, p+ diffused region 210 has a top surface area of 1 mm (length) or less×1 mm (width) or less. In one embodiment, the top surface area of p+ diffused region 210 is 1 mm×1 mm.

Figure 1B:
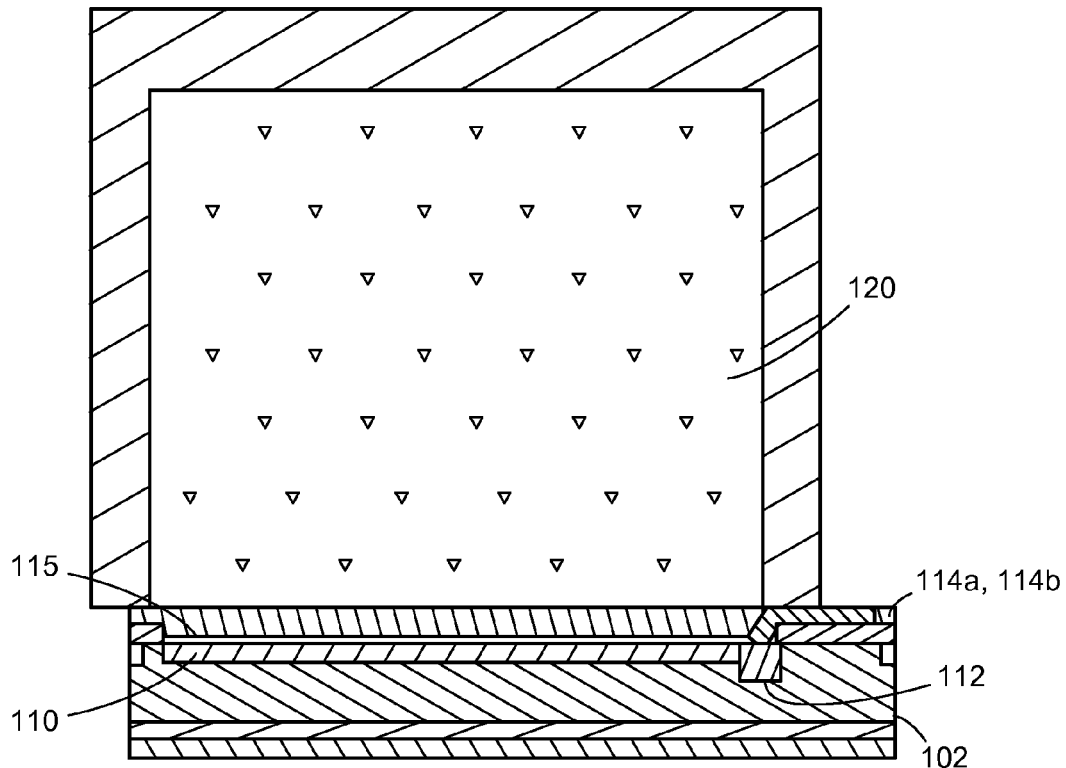
FIG. 1b is a cross-sectional view of a conventional, prior art photodiode with a scintillator crystal mounted on the front side of the photodiode.

Further, photodiode 200 can be fabricated on a low cost, low resistivity silicon wafer substrate 205, on the order of 1000-2000 ohm cm, while still retaining the capacitance performance of the conventional 2 mm×2 mm p+ diffused area photodiode described in FIGS. 1a and 1b above, which is processed on relatively expensive higher resistivity 4500-9000 ohm cm silicon material.

Persons having ordinary skill in the art should appreciate that the p+ diffused area 210 is smaller, more specifically 1 mm×1 mm (versus 2 mm×2 mm of the prior art photodiodes shown in FIGS. 1a and 1b) and the substrate material 205 has a lower resistivity, more specifically, ranging from 1000-2000 ohm cm (versus 4500-9000 ohm cm of the prior art photodiodes shown in FIGS. 1a and 1b), and thus, photodiode 200 of the present invention has lower dark current and lower capacitance, resulting in an improved signal-to-noise ratio. In order to retain the performance characteristics of the photodiode, while still employing a relatively small p+ diffused active area and a low resistivity starting material, the photodiode further comprises a reflective metal shield 225, described in further detail below.

Additionally, because of the relatively small p+ diffused area 210 of the photodiode of the present invention, there is a wider distance between the p+ diffused area and the edge of the photodiode chip, than in the conventional photodiode described in FIGS. 1a and 1b, reducing sawing damage and increasing yield or throughput of the photodiode. More specifically and referring back to FIG. 1a, in a typical photodiode chip, distance 129 between the p+ diffused area 110 and the edge 130 of the photodiode 100 ranges from 0.1 mm to 0.125 mm. Referring back to FIG. 2a, however, in the photodiode chip 200 of the present invention, distance 229 between the p+ diffused area 210 and the edge 230 of the photodiode 200 ranges from 0.3 mm to 0.5 mm, and is thus wider, allowing for more sawing room.

Referring to FIGS. 2a and 2b, in one embodiment, photodiode 200 further comprises deep diffused p+ region 212, which is a heavily doped p+ region that is employed to reduce the resistance of the long neck 216 of the device, as shown in FIG. 2a.

In one embodiment, photodiode 200 further comprises anode metal layers (pads) 214a and 214b for forming contacts and for forming wire bonds, respectively. In one embodiment, metal layers 214a and 214b are fabricated from a high reflectance material, such as aluminum, having a thickness of approximately 1 µm.

In one embodiment, photodiode 200 further comprises layer 215 (shown only in FIG. 2b), which is, in one embodiment, a relatively thin layer comprised of silicon oxide/silicon nitride that acts as junction passivation and antireflection layer. In one embodiment, layer 215 is an anti-reflective layer comprised of $SiO_2$ having a thickness of 900 Å. In another embodiment, layer 215 is an anti-reflective layer comprised of both $SiO_2$, having a thickness of 150 Å and $Si_3N_4$, having a thickness of 400 Å, for a total layer thickness of 550 Å.

Referring now to FIG. 2b, photodiode 200 includes a mounted scintillator crystal 220, which, in one embodiment, has a top surface area that is greater than the area of the p+ diffused active area 210. In one embodiment, the top surface area of mounted scintillator crystal 220 is on the order of 2 mm×2 mm. Additionally, photodiode 200 further comprises metal shield 225, which is formed on at least a portion of the top surface of the photodiode chip 200 and employed as a mirror to reflect incident light back into the scintillator crystal 220. In one embodiment, metal shield 225 is formed from aluminum. In one embodiment, the metal shield 225 has the same dimensions and surface area as the scintillator crystal.

Thus, in one embodiment, the photodiode of the present invention is a photodiode and/or photodiode array having a relatively small p+ diffused active area, in which at least a portion of the front or top surface of the photodiode or photodiode array is covered with a metal shield, employed as a reflective surface to reflect incident light back into a scintillator crystal mounted on the front side of the photodiode. In one embodiment, the relatively small p+ diffused area that is smaller than the area of a scintillator crystal that is mounted on the top surface of the photodiode.

Figure 3:
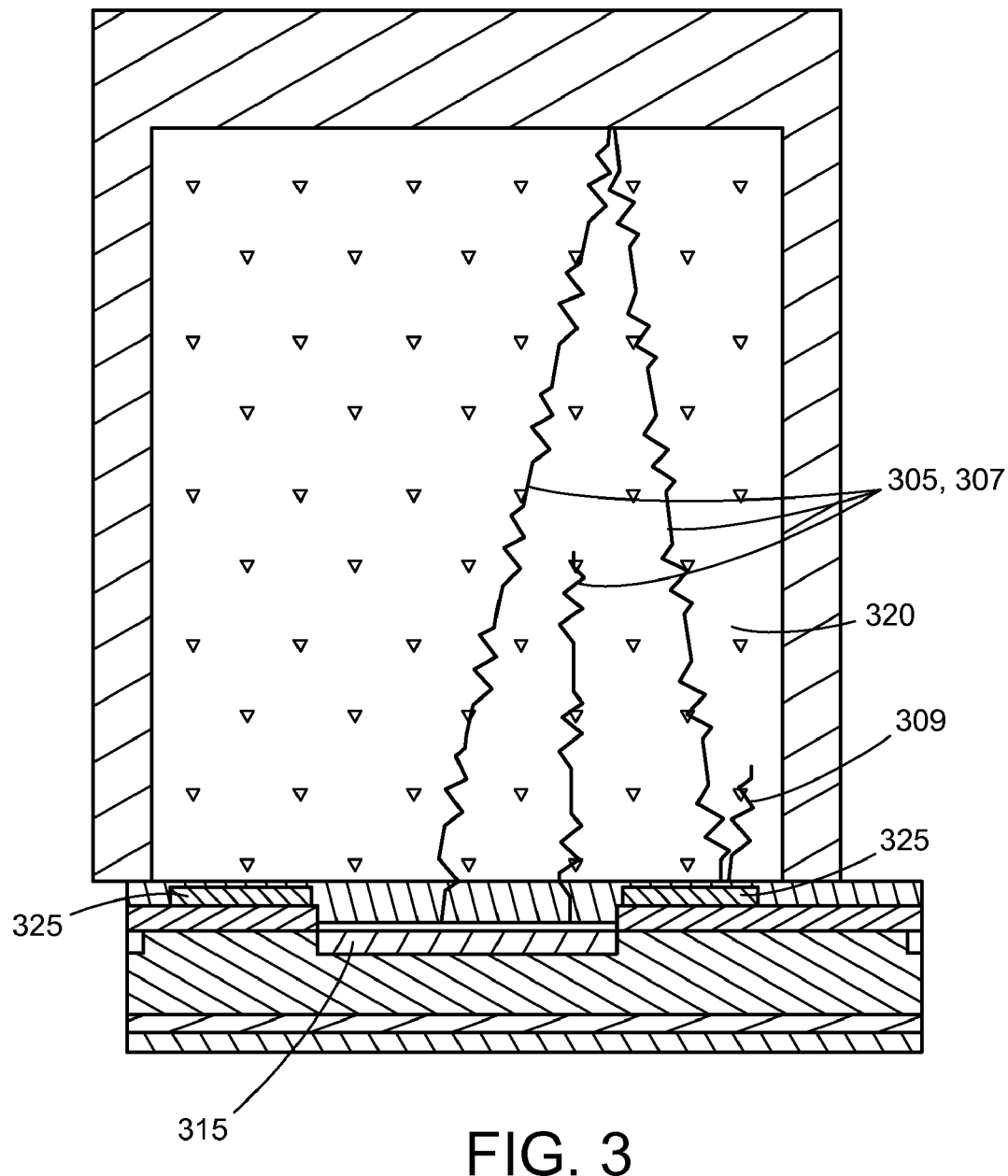
FIG. 3 is a cross-sectional view of one embodiment of photodiode of the present invention, illustrating light reflected from the metal shield undergoing multiple reflections from within the mounted scintillator crystal.

In one embodiment, the reflective metal shield increases the performance of the photodiode and compensates for the smaller p+ diffused active area in terms of performance characteristics, and more specifically, low capacitance. FIG. 3 illustrates how a photodiode or photodiode array that employs a reflective metal shield in conjunction with a p+ diffused active area that is smaller than the area of the mounted scintillator crystal can still exhibit the same or better performance characteristics as a conventional photodiode with a larger p+ diffused active area that is equal to the area of the mounted scintillator crystal.

Referring now to FIG. 3, light reflected from the metal shield undergoing multiple reflections from within the scintillator crystal 320 is depicted, where light 305 travels at least one path 307. Light not initially collected by p+ shallow diffused region 315 is reflected from metal shield 325. It then creates incident light path 309 back into the scintillator crystal 320. The light undergoes multiple reflections within the scintillator crystal and finally arrives at the 1 mm×1 mm diffused area. Thereafter, it is collected by the 1 mm×1 mm p+ shallow diffused region/active area 315.

An exemplary manufacturing process of one embodiment of the photodiode of the present invention will now be described in greater detail. Persons of ordinary skill in the art should note that although one exemplary manufacturing process is described herein, various modifications may be made without departing from the scope and spirit of the invention. Modifications or alterations to the manufacturing steps, their corresponding details, and any order presented may be readily apparent to those of ordinary skill in the art. Thus, the present invention contemplates many possibilities for manufacturing the photodiode of the present invention and is not limited to the examples provided herein.

Figure 4A:
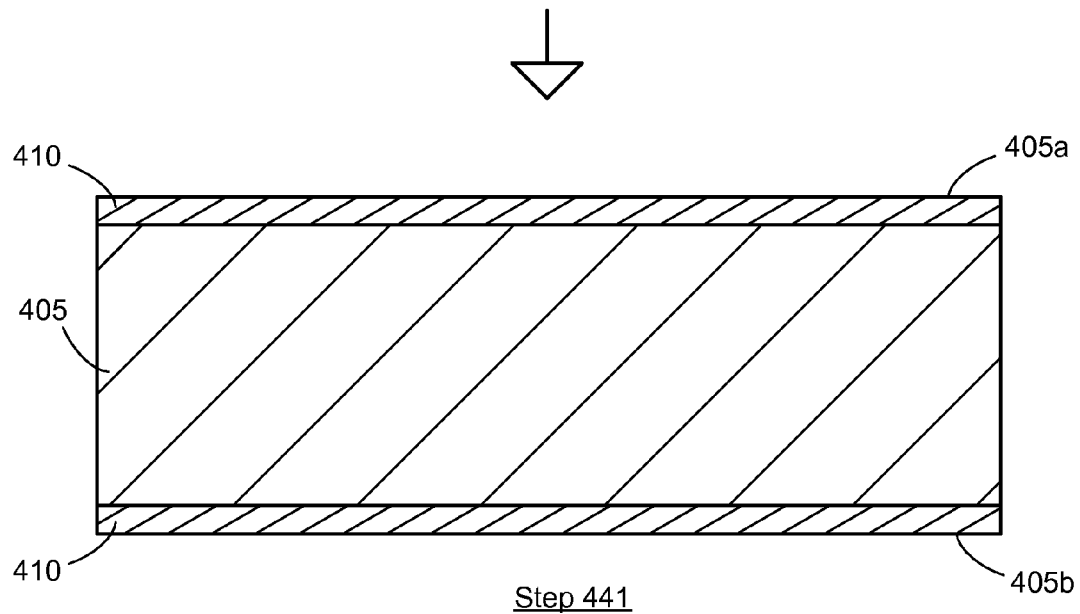
FIG. 4a is a cross-sectional of a low resistivity substrate wafer after a mask oxidation step, in one embodiment of the manufacture of the photodiode of the present invention.

FIGS. 4a through 4f depict cross-sectional views of exemplary manufacturing steps of the photodiode of the present invention. Referring now to FIG. 4a, the starting material is a device wafer 405, which, in one embodiment, is silicon, n-type wafer, having a resistivity ranging from 1000-2000 ohm cm. In one embodiment, the n-type silicon substrate wafer has a thickness ranging from 300-400 μm. While it is preferred that the wafer substrate be comprised of silicon, one of ordinary skill in the art would appreciate that any suitable semiconductor material, which can be processed in accordance with the manufacturing steps of the present invention, may be used. In addition, device wafer 405 may optionally be polished on both the front side 405a and back side 405b to allow for greater conformity to parameters, surface flatness, and specification thickness. It should be understood by those of ordinary skill in the art, however, that the above specifications are not binding and that the type of material and resistivity can easily be changed to suit the design, fabrication, and functional requirements of the present invention.

Still referring to FIG. 4a, in step 441, device wafer 405 is subjected to a standard mask oxidation process that grows a mask oxide layer 410 on both the front side 405a and back side 405b of the device wafer 405. In one embodiment, the oxidation mask is comprised of $SiO_2$ and/or $Si_3N_4$ and thermal oxidation is employed to achieve mask oxidation. In one embodiment, the oxide layer 410 comprises silicon oxide ($SiO_2$) having a thickness of approximately 10,000 Å. Standard mask oxidation is well known to those of ordinary skill in the art and will not be described in further detail herein.

Figure 4B:
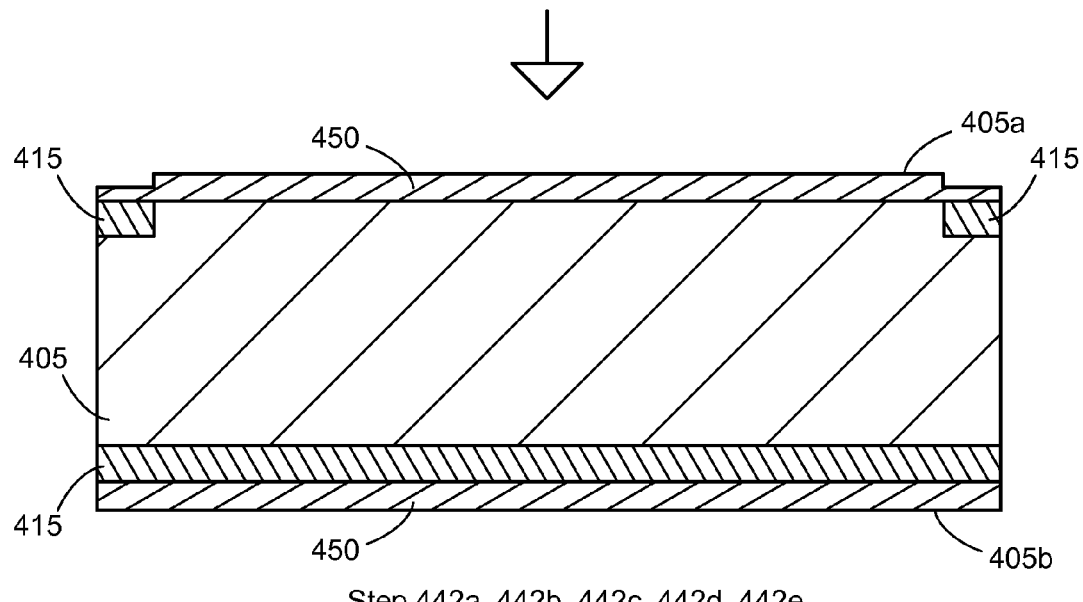
FIG. 4b is a cross-sectional view of the wafer shown in FIG. 4a, after a n+ masking, phosphorus diffusion, and front and back side oxidation step, in one embodiment of the manufacture of the photodiode of the present invention.

As shown in FIG. 4b, in step 442a, after the standard mask oxidation is complete, the device wafer 405 is subjected to n+ photolithography on the front side 405a and back side 405b of device wafer 405. After selecting a suitable material and creating a suitable photoresist pattern, a thin photoresist layer is applied to the front side 405a and back side 405b of device wafer 405 to etch the pattern on the surfaces of the wafer. Generally, the photoresist layer is a photosensitive polymeric material for photolithography and photoengraving that can form a patterned coating on a surface. In one embodiment, the photoresist layer is applied via a spin coating technique. Spin coating is well known to those of ordinary skill in the art and will not be described in detail herein.

In step 442b, the photoresist-coated device wafer 405 is aligned with an n+ mask. N+ masking techniques are employed to protect portions of device wafer 405. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The n+ mask allows selective irradiation of the photoresist on the device wafer. Regions that are exposed to radiation are removed while those that are protected from diffusion remain shielded by the n+ mask.

An intense light, such as UV light, is projected through the mask, exposing portions of the photoresist layer in the pattern of the n+ mask. The exposed and remaining photoresist is then subjected to a suitable chemical or plasma etching process to reveal the pattern transfer from the mask to the photoresist layer.

In one embodiment, the pattern of the photoresist layer and/or n+ mask defines a plurality of regions 415, on the front side and back side of device wafer 405, ready for n+ diffusion.

In step 442c, device wafer 405 is subjected to oxide etching on both the front side 405a and back side 405b to remove the silicon dioxide layer deposited in step 441.

In step 442d, the front side 405a and back side 405b of device wafer 405 are subjected to n+ diffusion followed by drive-in oxidation after the previous n+ masking and etching steps. Generally, diffusion facilitates propagation of a diffusing material through a host material. An appropriate amount of dopant atoms, such as phosphorous, is deposited onto the substrate wafer and fills the gaps left by the removed photoresist layer. Then, the wafer 405 is subjected to a drive-in oxidation process that is used to redistribute the dopant atoms and deposit them deeper into the wafer. In one embodiment, this process fills the plurality of regions 415, via deep diffusion, with n+ dopant.

In step 442e, exposed silicon surfaces, such as the remaining portions of front side 405a and back side 405b of device wafer 405, are covered with oxide layer 450. In one embodiment, oxide layer 450 has a thickness of approximately 3,000 Å.

Figure 4C:
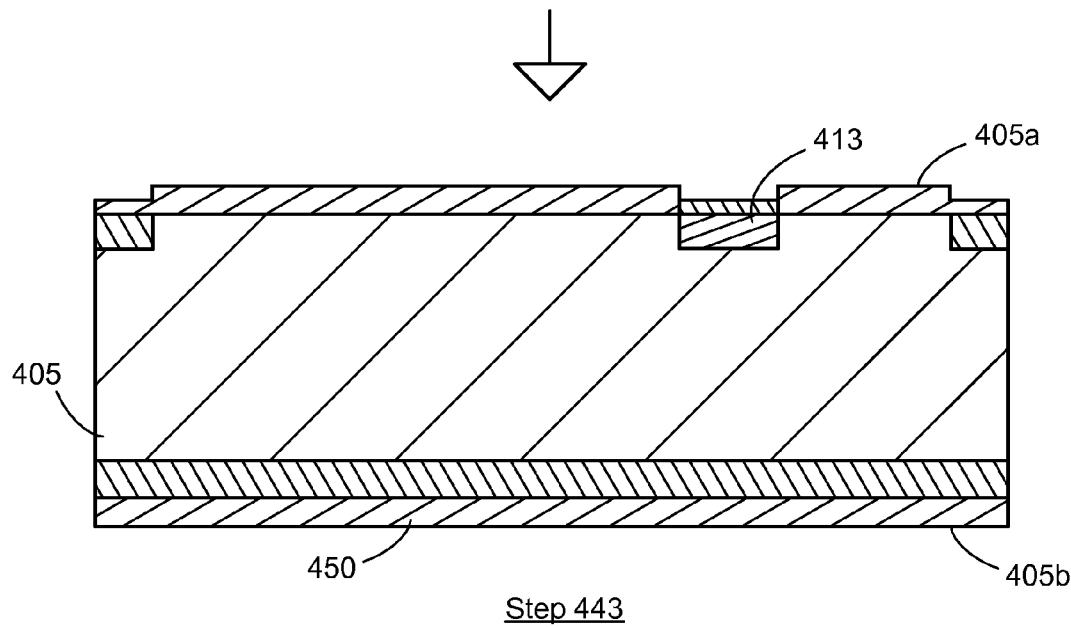
FIG. 4c is a cross-sectional view of the wafer shown in FIG. 4b, after a front side p+ masking and deep boron diffusion step, in one embodiment of the manufacture of the photodiode of the present invention.

Referring now to FIG. 4c, in step 443, front side 405a of device wafer 405 is subjected to a p+ lithography process, creating deep p+ diffused region 413. In one embodiment, the p+ dopant is boron. As with any conventional lithography process, p+ lithography comprises at least the following tasks, but not limited to such tasks: substrate preparation; photoresist application; soft baking; mask alignment; exposure; development; hard backing; and etching. In addition, various other chemical treatments may be performed.

The p+ masking and diffusion process is similar to that delineated with respect to the n+ masking process described earlier and will not be repeated in detail herein. The p+ masking process further comprises deposition and deep drive-in oxidation, allowing for predefined and/or predetermined thermal budget in accord with the principles of the present invention. The exposed silicon surface of region 413 is subsequently oxidized.

Figure 4D:
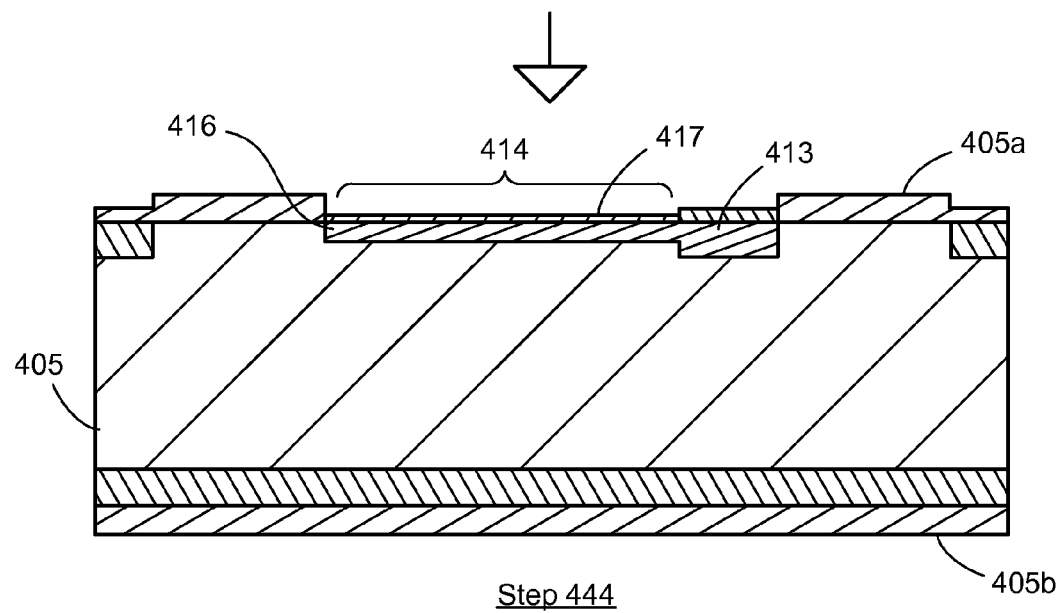
FIG. 4d is a cross-sectional view of the wafer shown in FIG. 4c, after active area masking, anti-reflective layer growth, and boron implant and annealing steps, in one embodiment of the manufacture of the photodiode of the present invention.

In step 444, as shown in FIG. 4d, the device wafer 405 is subjected to active area photolithography and oxide etching, using an active area mask, to fabricate active area 414 on the front side 405a.

Thereafter, an anti-reflective (AR) layer 417 is grown on the front side of the device via thermal oxidation and/or CVD chemical deposition, such as the thermal growth of a layer comprised of $SiO_2$, having a thickness of 150 Å followed by the LPCVD deposition of $Si_3N_4$, having a thickness of 400 Å, for a total layer thickness of 550 Å.

Persons of ordinary skill in the art would appreciate that various anti-reflective coating designs, such as 1-layer, 2-layer, 3-layer, and 4+-layer may be employed. By way of example, and by no means limiting, the anti-reflective coating design adopted herein utilizes thin film materials, such as oxides, sulfides, fluorides, nitrides, selenides, and metals, among others. In one embodiment of the present invention, the anti-reflective layer comprises silicon oxide/silicon nitride.

This is followed by boron implant and annealing, through the AR layer, to form a shallow p+ active area 416. The active area specifications, among other parameters, comprise significant performance characteristics of the photodiode. In one embodiment, active area 414 is 1 mm×1 mm on the top surface or front side 405a of the photodiode.

Figure 4E:
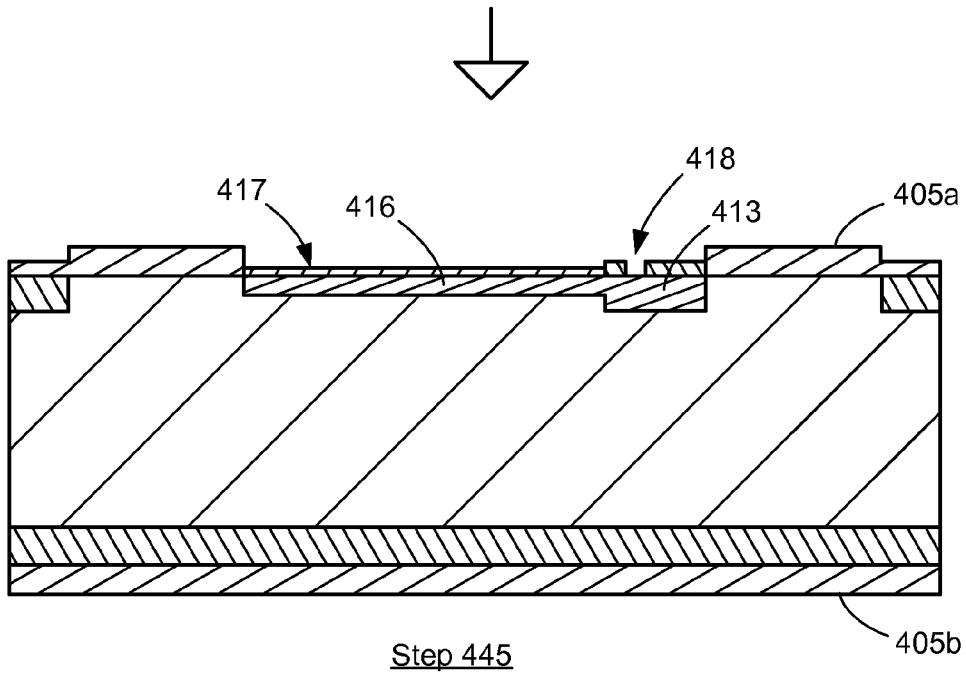
FIG. 4e is a cross-sectional view of the wafer shown in FIG. 4d, after a contact window masking step, in one embodiment of the manufacture of the photodiode of the present invention.

Thereafter, in step 445, shown in FIG. 4e, a contact etch mask is used to etch a contact window 418 into the front side 405a of wafer device 405. The contact window 418 is formed using standard semiconductor technology photolithography techniques.

Contact lithography, well known to those of ordinary skill in the art, involves printing an image or pattern via illumination of a photomask in direct contact with a substrate coated with an imaging photoresist layer. Typically, a contact window is an aperture defined in a surface passivation layer through which device metallization develops contact with circuit elements. In one embodiment, the contact window mask is a dark field mask, which is used to remove the silicon oxide/silicon nitride layer in the region requiring contacts. While contact masks have conventionally been fairly large (of the order of 100 mm or higher), it is possible that alignment tolerances may necessitate smaller mask sizes to allow stepping between exposures. As in nano-imprint lithography, the mask needs to have roughly the same feature size as the desired image.

In one embodiment of the photodiode of the present invention, a contact window mask is first applied, followed by etching contact window oxide/nitride on region 418. The contact window oxide/nitride used in the process is subsequently removed by either standard wet or standard dry etching techniques as are well known to those of ordinary skill in the art.

Using the contact mask, the contact window 418 is opened through the protective passivation (AR) layer 417 deposited on the surface of the device wafer. In one embodiment, oxide and nitride and thus, contact window, etching is achieved via a chemical etching process, wherein the wafer is immersed in buffered oxide etch (BOE), a HF acid-based solution for intervals sufficient to remove the layers exposed by the contact window mask.

Figure 4F:
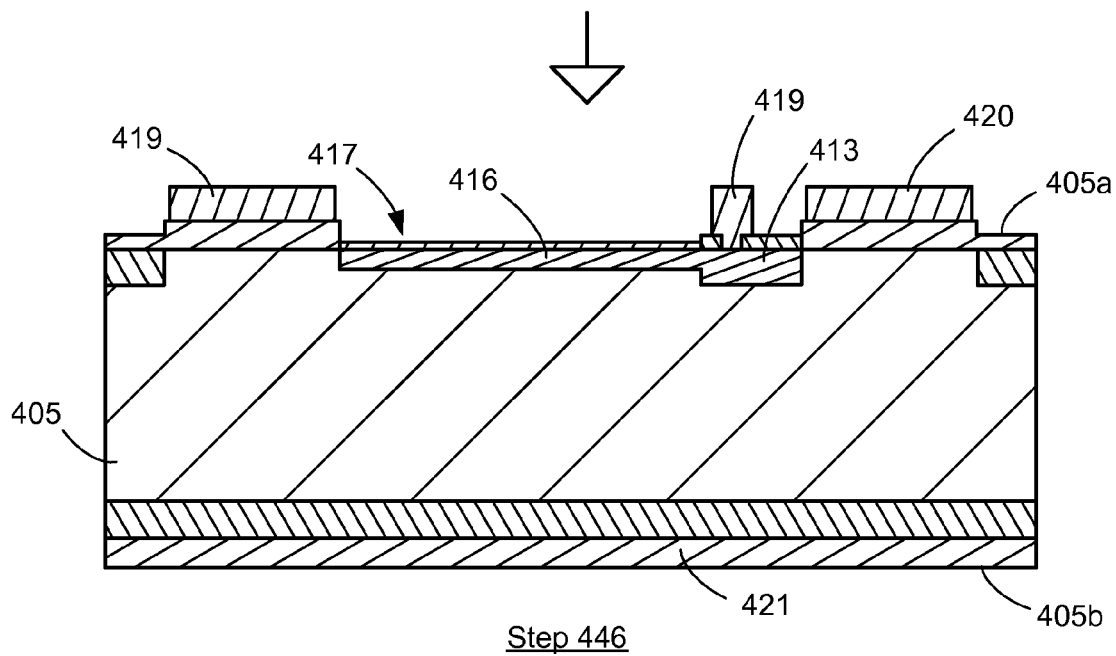
FIG. 4f is a cross-sectional view of the wafer shown in FIG. 4e, after at least one metallization step, in one embodiment of the manufacture of the photodiode of the present invention.

Referring now to FIG. 4f, in step 446, the device wafer 405 is subjected to a metal deposition process to etch metal on the front side 405a and back side 405b of device wafer 405 for creating electrical connections. In one embodiment, the metal deposition process is also used to form a metal shield 420 on front side 405a of device wafer 405, which is employed as a mirror to reflect incident light back into a scintillator crystal (not shown) that is mounted on the front side photodiode. The metal shield has been described in detail with respect to FIGS. 2a, 2b, and 3 and such details will not be repeated herein.

The most common metals include aluminum, nickel, chromium, gold, germanium, copper, silver, titanium, tungsten, platinum, and tantalum. Selected metal alloys may also be used. Metallization is often accomplished with a vacuum deposition technique. The most common deposition process include filament evaporation, electron-beam evaporation, flash evaporation, induction evaporation, and sputtering, followed by metal masking and etching.

In one embodiment, a metal mask is employed to achieve a pattern metallization. Aluminum etching is performed on the front side, to form anode contacts 419 and metal shield 420, using a variety of methods, including, but not limited to abrasive etching, dry etching, electroetching, laser etching, photo etching, reactive ion etching (RIE), sputter etching, and vapor phase etching. Similarly, chrome/gold metallization is performed on the back side of the photodiode, thus forming the cathode 421.

The above examples are merely illustrative of the structure and manufacturing steps of the photodiode array of the present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention may be modified within the scope of the appended claims.

We claim:

1. A photodiode comprising:
    a low resistivity substrate having at least a front side and a back side, wherein said low resistivity is in the range of 1000 ohm cm to 2000 ohm cm;
    a shallow p+ diffused region on said front side, wherein said shallow p+ region is smaller than a scintillator crystal mounted on the front side of the photodiode;
    at least one back side cathode contact and at least one front side anode contact, comprised of metal; and
    a reflective metal shield on at least a portion of said front side, wherein said metal shield reflects incident light back into said scintillator crystal.

2. The photodiode of claim 1 wherein said scintillator crystal mounted on the front side of the photodiode has a top surface area of 2 mm×2 mm.

3. The photodiode of claim 1 wherein the shallow p+ diffused region is on the order of 1 mm or less in length and 1 mm or less in width.

4. The photodiode of claim 1 wherein the reflective metal shield comprises aluminum.

5. The photodiode of claim 1, wherein a distance between the shallow p+ diffused region and an edge of the photodiode ranges from 0.3 mm to 0.5 mm.

6. The photodiode of claim 1 further comprising an anti-reflective layer formed from $SiO_2$ having a thickness of 900 Å.

7. The photodiode of claim 1 further comprising an anti-reflective layer formed from $SiO_2$ having a thickness of 150 Å and $Si_3N_4$ having a thickness of 400 Å, for a total layer thickness of 550 Å.

8. A photodiode array comprising:
    a low resistivity substrate having at least a front side and a back side, wherein said low resistivity is in the range of 1000 ohm cm to 2000 ohm cm;
    a plurality of diode elements integrally formed in the substrate forming said array, wherein each diode element has a shallow p+ diffused region on said front side, wherein said shallow p+ region is smaller than a scintillator crystal mounted on the front side of the photodiode;

at least one back side cathode contact and at least one front side anode contact, comprised of metal; and a reflective metal shield on at least a portion of said front side, wherein said metal shield reflects incident light back into the scintillator crystal.

9. The photodiode array of claim 8 wherein said scintillator crystal mounted on the front side of the photodiode element has a top surface area of 2 mm×2 mm.

10. The photodiode array of claim 8 wherein the shallow p+ diffused region is approximately 1 mm or less in length and 1 mm or less in width.

11. A method of fabricating a photodiode on a low resistivity substrate wafer having a front side and a back side, said method comprising the steps of:

providing an oxide layer on both the front side and the back side;

implementing an etching process on both the front side and back side to define a plurality of regions on the front side and back side;

filling the plurality of regions with n+ dopant;

depositing an oxide layer on both the front side and the back side of the wafer;

creating a deep p+ diffused region on the front side;

fabricating an active area on said front side, wherein said active area is smaller than a scintillator crystal mounted on the front side of the photodiode;

forming an anti-reflective layer on the front side of said device;

forming a shallow p+ active area region;

forming at least one contact window; and performing a metal deposition process to etch metal on both the front side and back side of the device wafer, wherein said metal deposition process creates connections and wherein said metal deposition process forms a reflective metal shield on the front side.

12. The method of claim 11 wherein said low resistivity substrate has a resistivity in the range of 1000 ohm cm to 2000 ohm cm.

13. The method of claim 11 wherein the step of providing an oxide layer on both the front side and the back side results in an oxide layer having a thickness of approximately 10,000 Å.

14. The method of claim 11 wherein said anti-reflective layer is formed on said front side of said device via thermal growth of a layer of $SiO_2$, having a thickness of 150 Å followed by LPCVD deposition of $Si_3N_4$, having a thickness of 400 Å, for a total layer thickness of 550 Å.

15. The method of claim 12 wherein the metal shield on the front side of the device wafer reflects incident light back into the scintillator crystal mounted on the photodiode.

* * * * *